United States Patent
Jiang et al.

(10) Patent No.: US 11,811,429 B2
(45) Date of Patent: Nov. 7, 2023

(54) VARIATIONAL DROPOUT WITH SMOOTHNESS REGULARIZATION FOR NEURAL NETWORK MODEL COMPRESSION

(71) Applicant: TENCENT AMERICA LLC, Palo Alto, CA (US)

(72) Inventors: Wei Jiang, Palo Alto, CA (US); Wei Wang, Palo Alto, CA (US); Shan Liu, Palo Alto, CA (US)

(73) Assignee: TENCENT AMERICA LLC, Palo Alto, CA (US)

( * ) Notice: Subject to any disclaimer, the term of this patent is extended or adjusted under 35 U.S.C. 154(b) by 645 days.

(21) Appl. No.: 17/034,739

(22) Filed: Sep. 28, 2020

(65) Prior Publication Data

US 2021/0111736 A1    Apr. 15, 2021

Related U.S. Application Data

(60) Provisional application No. 62/939,060, filed on Nov. 22, 2019, provisional application No. 62/915,337, filed on Oct. 15, 2019.

(51) Int. Cl.
| | | |
|---|---|---|
| H03M 7/00 | (2006.01) | |
| H03M 7/30 | (2006.01) | |
| G06N 3/084 | (2023.01) | |
| G06N 5/046 | (2023.01) | |
| G06F 18/211 | (2023.01) | |
| G06F 18/214 | (2023.01) | |
| G06V 10/764 | (2022.01) | |
| G06V 10/82 | (2022.01) | |

(52) U.S. Cl.
CPC ............ *H03M 7/70* (2013.01); *G06F 18/211* (2023.01); *G06F 18/2155* (2023.01); *G06N 3/084* (2013.01); *G06N 5/046* (2013.01); *G06V 10/764* (2022.01); *G06V 10/82* (2022.01); *H03M 7/60* (2013.01)

(58) Field of Classification Search
CPC . H03M 7/70; H03M 7/60; H03M 7/40; G06F 18/211; G06F 18/2155; G06N 3/084; G06N 5/046; G06N 3/045; G06N 3/082; G06V 10/764; G06V 10/82
See application file for complete search history.

(56) References Cited

U.S. PATENT DOCUMENTS 10,748,062 B2 * 8/2020 Rippel ................. G06N 3/0455
11,025,907 B2 * 6/2021 Li ........................ H04N 19/119
(Continued)

OTHER PUBLICATIONS

Alessandro Achille et al., "Critical learning Periods in Deep Networks", Published as a conference paper at ICLR 2019, 14 pages.
(Continued)

*Primary Examiner* — Jean B Jeanglaude
(74) *Attorney, Agent, or Firm* — Sughrue Mion, PLLC

(57) ABSTRACT

A method, computer program, and computer system is provided for compressing a deep neural network model. Weight coefficients associated with a deep neural network are quantize and entropy-coded. The quantized and entropy-coded weight coefficients are locally smoothed. The smoothed weight coefficients are compressed based on applying a variational dropout to the weight coefficients.

20 Claims, 8 Drawing Sheets

(56) References Cited

U.S. PATENT DOCUMENTS

| | | | | |
|---|---|---|---|---|
| 11,496,769 | B2* | 11/2022 | Zhai | H04N 19/60 |
| 2011/0170607 | A1* | 7/2011 | Carmichael | H04N 19/51 |
| | | | | 375/240.18 |
| 2019/0394459 | A1* | 12/2019 | Ye | H04N 19/105 |
| 2022/0385896 | A1* | 12/2022 | Ding | G06N 3/0464 |

OTHER PUBLICATIONS

Pavlo Molchanov et al., "Importance Estimation for Neural Network Pruning", 9 pages.

Jianbo Ye et al., "Rethinking The Smaller-Norm-Less-Informative Assumption in Channel Pruning of Convolution Layers", Published as a conference paper at ICLR 2018, 11 pages.

Augustus Odena, "Semi-Supervised Learning with Generative Adversarial Networks", To appear in the Data Efficient Machine learning workshop at ICML 2016, 3 pages.

Dmitry Molchanov et al., "Variational Dropout Sparsifies Deep Neural Networks", Proceedings of the 34$^{th}$ International Conference on Machine Learning, Sydney, Austrailia, PMLR 70, 2017, Copyright 2017 by the authors, 10 pages.

* cited by examiner

VARIATIONAL DROPOUT WITH SMOOTHNESS REGULARIZATION FOR NEURAL NETWORK MODEL COMPRESSION

CROSS-REFERENCE TO RELATED APPLICATIONS

This application claims priority based on U.S. Provisional Application Nos. 62/915,337 (filed Oct. 15, 2019) and 62/939,060 (filed Nov. 22, 2019), the entirety of which are incorporated herein.

FIELD

This disclosure relates generally to field of data processing, and more particularly to neural networks.

BACKGROUND

ISO/IEC MPEG (JTC 1/SC 29/WG 11) has been actively searching for potential needs for standardization of future video coding technology for visual analysis and understanding. The Compact Descriptors for Visual Search (CDVS) standard was adopted by ISO in 2015 as a still-image standard, which extracts feature representations for image similarity matching. The Compact Descriptors for Visual Analysis (CDVS) standard is listed as Part 15 of MPEG 7 and ISO/IEC 15938-15 and was finalized in 2018, which extracts global and local, hand-designed and DNN-based, feature descriptors for video segments. The success of Deep Neural Network (DNN) in a large range of video applications such as semantic classification, target detection/recognition, target tracking, video quality enhancement, etc. poses a strong need for compressing the DNN models. Therefore, MPEG is actively working on the Coded Representation of Neural Network standard (NNR), which encodes DNN models to save both storage and computation. There exist several approaches for learning a compact DNN model. The target is to remove unimportant weight coefficients and the assumption is that the smaller the weight coefficients are in value, the lower their importance is.

SUMMARY

Embodiments relate to a method, system, and computer readable medium for compression a deep neural network model. According to one aspect, a method for compression a deep neural network model is provided. The method may include quantizing and entropy-coding weight coefficients associated with the deep neural network. Weight coefficients associated with a deep neural network are quantize and entropy-coded. The quantized and entropy-coded weight coefficients are locally smoothed. The smoothed weight coefficients are compressed based on applying a variational dropout to the weight coefficients.

According to another aspect, a computer system for compression a deep neural network model is provided. The computer system may include one or more processors, one or more computer-readable memories, one or more computer-readable tangible storage devices, and program instructions stored on at least one of the one or more storage devices for execution by at least one of the one or more processors via at least one of the one or more memories, whereby the computer system is capable of performing a method. The method may include quantizing and entropy-coding weight coefficients associated with the deep neural network. Weight coefficients associated with a deep neural network are quantize and entropy-coded. The quantized and entropy-coded weight coefficients are locally smoothed. The smoothed weight coefficients are compressed based on applying a variational dropout to the weight coefficients.

According to yet another aspect, a computer readable medium for compressing a deep neural network model is provided. The computer readable medium may include one or more computer-readable storage devices and program instructions stored on at least one of the one or more tangible storage devices, the program instructions executable by a processor. The program instructions are executable by a processor for performing a method that may accordingly include quantizing and entropy-coding weight coefficients associated with the deep neural network. Weight coefficients associated with a deep neural network are quantize and entropy-coded. The quantized and entropy-coded weight coefficients are locally smoothed. The smoothed weight coefficients are compressed based on applying a variational dropout to the weight coefficients.

BRIEF DESCRIPTION OF THE DRAWINGS

These and other objects, features and advantages will become apparent from the following detailed description of illustrative embodiments, which is to be read in connection with the accompanying drawings. The various features of the drawings are not to scale as the illustrations are for clarity in facilitating the understanding of one skilled in the art in conjunction with the detailed description. In the drawings.

DETAILED DESCRIPTION

Figure 1:
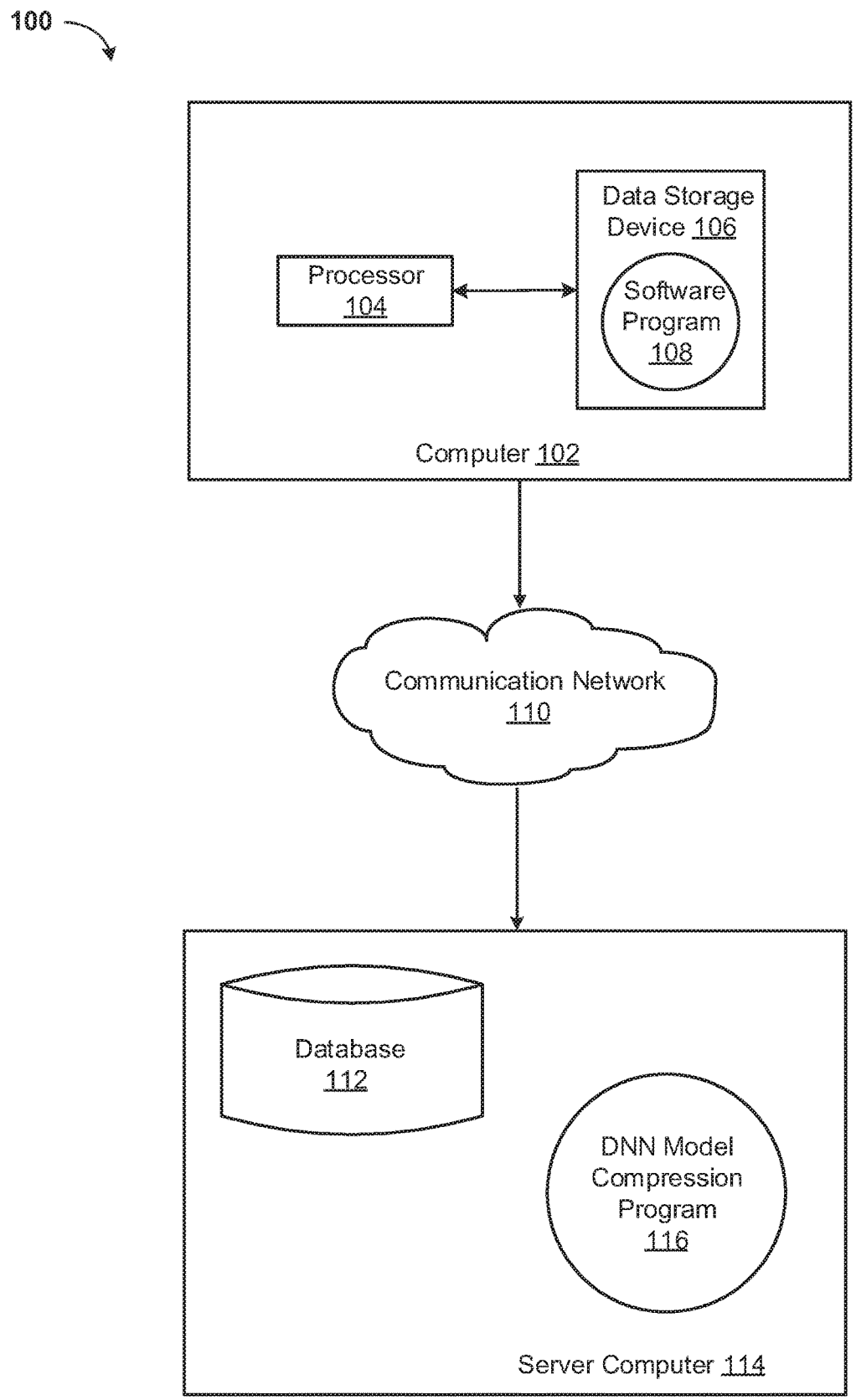
FIG. 1 illustrates a networked computer environment according to at least one embodiment.

Detailed embodiments of the claimed structures and methods are disclosed herein; however, it can be understood that the disclosed embodiments are merely illustrative of the claimed structures and methods that may be embodied in various forms. Those structures and methods may, however, be embodied in many different forms and should not be construed as limited to the exemplary embodiments set forth herein. Rather, these exemplary embodiments are provided so that this disclosure will be thorough and complete and will fully convey the scope to those skilled in the art. In the description, details of well-known features and techniques may be omitted to avoid unnecessarily obscuring the presented embodiments.

Embodiments relate generally to the field of data processing, and more particularly to neural networks. The following described exemplary embodiments provide a system, method and computer program to, among other things, compress a deep neural network (DNN) model by using a smoothness regularization in a variational dropout (VD) framework. Therefore, some embodiments have the capacity to improve the field of computing by improve compression efficiency of learned weight coefficients, which can significantly reduce a DNN model size.

As previously described, ISO/IEC MPEG (JTC 1/SC 29/WG 11) has been actively searching for potential needs for standardization of future video coding technology for visual analysis and understanding. The Compact Descriptors for Visual Search (CDVS) standard was adopted by ISO in 2015 as a still-image standard, which extracts feature representations for image similarity matching. The Compact Descriptors for Visual Analysis (CDVS) standard is listed as Part 15 of MPEG 7 and ISO/IEC 15938-15 and was finalized in 2018, which extracts global and local, hand-designed and DNN-based, feature descriptors for video segments. The success of Deep Neural Network (DNN) in a large range of video applications such as semantic classification, target detection/recognition, target tracking, video quality enhancement, etc. poses a strong need for compressing the DNN models. Therefore, MPEG is actively working on the Coded Representation of Neural Network standard (NNR), which encodes DNN models to save both storage and computation. There exist several approaches for learning a compact DNN model. The target is to remove unimportant weight coefficients and the assumption is that the smaller the weight coefficients are in value, the lower their importance is.

However, some methods explicitly pursue this goal by either greedily removing network parameters or by adding sparsity-promoting regularization terms into the network training target. These methods are usually called network pruning methods. On the other hand, the dropout method is widely used in neural network training as an effective way to avoid overfitting, and it has been proven theoretically that Variational Dropout (VD) has the effect of implicitly sparsifying network parameters. From the perspective of compressing DNN models, after learning a compact network model, the weight coefficients can be further compressed by quantization followed by entropy coding. Such further compression processes can significantly reduce the storage size of the DNN model, which are essential for model deployment over mobile devices, chips, etc. It may be advantageous, therefore, for the sparsified weight coefficients to be locally smooth to improve the efficiency of model compression. By integrating a smoothness regularization into the VD framework in training the compact DNN model, the learned weight coefficients are suitable for further compression. Three different frameworks may be used for learning the compact DNN model with VD and smoothness regularization, with fully annotated data, unlabeled data, or partially labeled data, respectively.

Aspects are described herein with reference to flowchart illustrations and/or block diagrams of methods, apparatus (systems), and computer readable media according to the various embodiments. It will be understood that each block of the flowchart illustrations and/or block diagrams, and combinations of blocks in the flowchart illustrations and/or block diagrams, can be implemented by computer readable program instructions.

Referring now to FIG. 1, a functional block diagram of a networked computer environment illustrating a deep neural network model compression system 100 (hereinafter "system") for compressing a deep neural network model. It should be appreciated that FIG. 1 provides only an illustration of one implementation and does not imply any limitations with regard to the environments in which different embodiments may be implemented. Many modifications to the depicted environments may be made based on design and implementation requirements.

The system 100 may include a computer 102 and a server computer 114. The computer 102 may communicate with the server computer 114 via a communication network 110 (hereinafter "network"). The computer 102 may include a processor 104 and a software program 108 that is stored on a data storage device 106 and is enabled to interface with a user and communicate with the server computer 114. As will be discussed below with reference to FIG. 4 the computer 102 may include internal components 800A and external components 900A, respectively, and the server computer 114 may include internal components 800B and external components 900B, respectively. The computer 102 may be, for example, a mobile device, a telephone, a personal digital assistant, a netbook, a laptop computer, a tablet computer, a desktop computer, or any type of computing devices capable of running a program, accessing a network, and accessing a database.

The server computer 114 may also operate in a cloud computing service model, such as Software as a Service (SaaS), Platform as a Service (PaaS), or Infrastructure as a Service (IaaS), as discussed below with respect to FIGS. 5 and 6. The server computer 114 may also be located in a cloud computing deployment model, such as a private cloud, community cloud, public cloud, or hybrid cloud.

The server computer 114, which may be used for compressing a deep neural network model is enabled to run a DNN Model Compression Program 116 (hereinafter "program") that may interact with a database 112. The DNN Model Compression Program method is explained in more detail below with respect to FIG. 3. In one embodiment, the computer 102 may operate as an input device including a user interface while the program 116 may run primarily on server computer 114. In an alternative embodiment, the program 116 may run primarily on one or more computers 102 while the server computer 114 may be used for processing and storage of data used by the program 116. It should be noted that the program 116 may be a standalone program or may be integrated into a larger deep neural network model compression program.

It should be noted, however, that processing for the program 116 may, in some instances be shared amongst the computers 102 and the server computers 114 in any ratio. In another embodiment, the program 116 may operate on more than one computer, server computer, or some combination of computers and server computers, for example, a plurality of computers 102 communicating across the network 110 with a single server computer 114. In another embodiment, for example, the program 116 may operate on a plurality of server computers 114 communicating across the network 110 with a plurality of client computers. Alternatively, the program may operate on a network server communicating across the network with a server and a plurality of client computers.

The network 110 may include wired connections, wireless connections, fiber optic connections, or some combination thereof. In general, the network 110 can be any combination of connections and protocols that will support communications between the computer 102 and the server computer 114. The network 110 may include various types of networks, such as, for example, a local area network (LAN), a wide area network (WAN) such as the Internet, a telecommunication network such as the Public Switched Telephone Network (PSTN), a wireless network, a public switched network, a satellite network, a cellular network (e.g., a fifth generation (5G) network, a long-term evolution (LTE) network, a third generation (3G) network, a code division multiple access (CDMA) network, etc.), a public land mobile network (PLMN), a metropolitan area network (MAN), a private network, an ad hoc network, an intranet, a fiber optic-based network, or the like, and/or a combination of these or other types of networks.

The number and arrangement of devices and networks shown in FIG. 1 are provided as an example. In practice, there may be additional devices and/or networks, fewer devices and/or networks, different devices and/or networks, or differently arranged devices and/or networks than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of system 100 may perform one or more functions described as being performed by another set of devices of system 100.

$\mathcal{D} = \{(x,y)\}$ may denote a data set where a target y may be assigned to an input x. $\Theta = \{w\}$ may denote a set of weight coefficients of a DNN. The target may be to learn an optimal set of weight coefficients $\Theta^*$ so that a loss $\pounds(\mathcal{D}|\Theta)$ can be minimized. In this disclosure, the loss $\pounds(\mathcal{D}|\Theta)$ may be defined as:

$$\pounds(\mathcal{D}|\Theta) = \lambda_D \pounds_D(\mathcal{D}|\Theta) + \lambda_R \pounds_R(\Theta) + \lambda_S \pounds_S(\Theta),$$

where $\pounds_D(\mathcal{D}|\Theta)$ may be an empirical data loss whose form depends on specific tasks (e.g., the cross-entropy loss for classification tasks or $L_2$ loss for regression tasks). $\pounds_R(\Theta)$ may be a general regularization loss (e.g., the $L_1$ norm over weight coefficients). $\pounds_S(\Theta)$ may be a smoothness loss defined as:

$$\pounds_S(\Theta) = \sum_{j=1}^{N} L_s(W^j)$$

where $L_s(W^j)$ may be a smoothness loss over the j-th layer. N may be the total number of layers where the smoothness loss may be measured. $W^j$ may denote the weight coefficients of the j-th layer. $\lambda_D, \lambda_R, \lambda_S$ may be hyperparameters balancing the contributions of different losses.

Since $L_s(W^j)$ may be computed for each layer independently, it may be appreciated that the script j may be omitted without loss of generality. Given the weight coefficients W of a layer, W may be a 5-Dimension (5D) tensor with size $(c_i, k_1, k_2, k_3, c_o)$, the input to the layer may be a 4-Dimension (4D) tensor A of size $(h_i, w_i, d_i, c_i)$, and the output of the layer may be a 4D tensor B of size $(h_o, w_o, d_o, c_o)$. Each item in the 5D tensor may be a floating number. The output $B_{may\ be}$ computed through the convolution operation $\odot$ based on A and W:

$$B_{l',m',n',v} = \sum_{r=1}^{k_1} \sum_{s=1}^{k_2} \sum_{t=1}^{k_3} \sum_{u=1}^{c_i} W_{u,r,s,t,v} A_{u,l-\frac{k_1-1}{2}+r, m-\frac{k_2-1}{2}+s, n-\frac{k_3-1}{2}+t},$$

$$l = 1, \ldots, h_i, m = 1, \ldots, w_i, n = 1, \ldots, d_i, l' = 1, \ldots, h_o,$$

$$m' = 1, \ldots, w_o, n' = 1, \ldots, d_o, v = 1, \ldots, c_o.$$

The parameters $h_i$, $w_i$ and $d_i$ ($h_o$, $w_o$ and $d_o$) may be the height, weight and depth of the input tensor A (output tensor B). The parameter $c_i$ ($c_o$) may be the number of input (output) channel. The parameters $k_1$, $k_2$ and $k_3$ may be the size of the convolution kernel corresponding to the height, weight and depth axes, respectively. That is, for each output channel $v = 1, \ldots, c_o$, a 4D weight tensor $W_v$ of size $(c_i, k_1, k_2, k_3)$ may convolve with the input A. From this perspective, this disclosure proposes to measure the smoothness as:

$$L_s(W) = \sum_{v=1}^{c_o} S(W_v) = \sum_{v=1}^{c_o} \sum_{g(u,l,m,n) \in G} S(W_v, g(u,l,m,n)),$$

where $g(u,l,m,n) \in G$ may define a local neighborhood centered at $(u,l,m,n)$ with size $(N_1(u,l,m,n), N_2(u,l,m,n), N_3(u,l,m,n), N_4(u,l,m,n))$. G may be the group of such local neighborhoods. $S(W_v, g(u,l,m,n))$ may be a smoothness metric measured over weight coefficients for each local neighborhood. In one embodiment, the local neighborhood can have a fixed size for each location $(u,l,m,n)$, e.g., a 4D blob centered at $(u,l,m,n)$, and when $$u = \frac{c_i - 1}{2}, l = \frac{k_1 - 1}{2}, m = \frac{k_2 - 1}{2}, n = \frac{k_3 - 1}{2},$$

and $N_1(u,l,m,n) = c_i$, $N_2(u,l,m,n) = k_1$, $N_3(u,l,m,n) = k_2$, and $N_4(u,m,n) = k_3$, $g(u,l,m,n)$ covers the entire weight coefficients $W_v$.

The smoothness metric can take many forms. The weight coefficients may be defined to be in the neighborhood $g(u,l,m,n)$ as close to each other as possible. In one preferred embodiment, the smoothness metric may be defined as:

$$S(W_v, g(u,l,m,n)) = \beta_u \nabla_u^p(W_v) + \beta_l \nabla_l^p(W_v) + \beta_m \nabla_m^p(W_v) + \beta_n \nabla_n^p(W_v).$$

$\nabla_u(W_v)$, $\nabla_l(W_v)$, $\nabla_m(W_v)$, and $\nabla_n(W_v)$ may be further defined as:

$$\nabla_u^p(W_v) = \sum_{i \in N_1(u,l,m,n)} \sum_{j \in N_2(u,l,m,n)} \sum_{p \in N_3(u,l,m,n)} \sum_{q \in N_4(u,l,m,n)} |\partial_1(W_{i,j,p,q,v})|^p$$

$$\nabla_l^p(W_v) = \sum_{i \in N_1(u,l,m,n)} \sum_{j \in N_2(u,l,m,n)} \sum_{p \in N_3(u,l,m,n)} \sum_{q \in N_4(u,l,m,n)} |\partial_2(W_{i,j,p,q,v})|^p$$

$$\nabla_m^p(W_v) = \sum_{i \in N_1(u,l,m,n)} \sum_{j \in N_2(u,l,m,n)} \sum_{p \in N_3(u,l,m,n)} \sum_{q \in N_4(u,l,m,n)} |\partial_3(W_{i,j,p,q,v})|^p$$

$$\nabla_n^p(W_v) = \sum_{i \in N_1(u,l,m,n)} \sum_{j \in N_2(u,l,m,n)} \sum_{p \in N_3(u,l,m,n)} \sum_{q \in N_4(u,l,m,n)} |\partial_4(W_{i,j,p,q,v})|^p$$

where $\partial_1(W_{i,j,p,q,v})$, $\partial_2(W_{i,j,p,q,v})$, $\partial_3(W_{i,j,p,q,v})$, $\partial_4(W_{i,j,p,q,v})$ may be the absolute value of gradients of weight coefficients $W_v$ alone the four axes measured at location $(i,j,p,q)$, respectively, and $\beta_u$, $\beta_l$, $\beta_m$, $\beta_n$, may be hyperparameters balancing the contributions of the gradients alone different axes. Intuitively, the smoothness metric of Adjacent weight coefficients within the local neighborhood alone the different axes may be similar without dramatic changes. $\rho > 0$ may be a hyperparameter, and $\rho$ may be empirically set as $\rho = 1$. In one embodiment, the gradient may be simply computed as:

$$\partial_1(W_{i,j,p,q,v}) = W_{i+1,j,p,q,v} - W_{i,j,p,q,v}$$

$$\partial_2(W_{i,j,p,q,v}) = W_{i,j+1,p,q,v} - W_{i,j,p,q,v}$$

$$\partial_3(W_{i,j,p,q,v}) = W_{i,j,p+1,q,v} - W_{i,j,p,q,v}$$

$$\partial_4(W_{i,j,p,q,v}) = W_{i,j,p,q+1,v} - W_{i,j,p,q,v}$$

According to Bayesian inference, after data $\mathcal{D}$ arrives, the prior distribution $p(\mathcal{D}|\Theta)$ can be transformed into a posterior distribution $p(\Theta|\mathcal{D}) = p(\mathcal{D}|\Theta)p(\Theta)/p(\mathcal{D})$. For feasible computation, a parametric distribution $q_\pi(\Theta)$ may be used to approximate $p(\Theta|\mathcal{D})$, where $\pi$ may be the variational parameters for distribution $q_\pi(\Theta)$. The quality of this approximation may be measured by the Kullback- Leibler (KL) divergence: $D_{KL}(q_\pi(\Theta)\|p(\Theta|\mathcal{D}))$. The variational parameters $\pi$ can be found by maximizing the variational lower bound:

$$\mathcal{L}_D(\pi) - D_{KL}(q_\pi(\Theta)\|p(\Theta|\mathcal{D}))$$

$$\mathcal{L}_D(\pi) = \Sigma_{9x,y)} E_{q_\pi(\Theta)}[\log p(y|x,\Theta)].$$

$\mathcal{L}_D(\pi)$ may be the expected log-likelihood of data, and the variational lower bound may be an approximation of the negative of the empirical data loss (i.e., $-\mathcal{L}_D(\mathcal{D}|\Theta)$). In the case of DNN, for the weight coefficients W of a given layer, under the assumption that the weight coefficients may be independent, the KL divergence $D_{KL}(q_\pi(\Theta)\|p(\Theta|\mathcal{D}))$ can be rewritten to:

$$D_{KL}(q_\pi(\Theta)\|p(\Theta|\mathcal{D})) = \Sigma_i D_{KL(\Theta)}(q(W_i|\theta_i,\alpha_i)\|p(W_i)),$$

where $W_i$ may be the i-th weight coefficient in W, $\theta_i$, $\alpha_i$ may be variational parameters for generating $W_i$:

$$W_i = \theta_i(1 + \sqrt{\alpha_i}\varepsilon_i)$$

$\varepsilon_i$ may follow the Gaussian distribution N(0,1). $D_{KL(\Theta)}(q(W_i|\theta_i,\alpha_i)\|p(W_i))$ can be further approximated as:

$$D_{KL(\Theta)}(q(W_i|\theta_i,\alpha_i)\|p(W_i)) \approx -(\tau_1\sigma(\tau_2+\tau_3 \log \alpha_i) - 0.5 \log(1+\alpha_i^{-1}) + C)$$

$\tau_1 = 0.63576$, $\tau_2 = 1.87320$, $\tau_3 = 1.48695$, where $\sigma(\cdot)$ may denote a sigmoid function, and C may be a constant which may be empirically set as $-\tau_1$.

For fixed variational parameters $\alpha_i$, the KL divergence $D_{KL}(q_\pi(\Theta)\|p(\Theta|\mathcal{D}))$ can be computed. With fixed variational parameters $\alpha_i$ and $\theta_i$, the weight coefficients W of the network layer can be computed, and the expected log-likelihood of data can be estimated by passing data input x through the network to generate data output y. Therefore, the total variational lower bound can be computed.

Optimization methods such as Stochastic Gradient Descent (SGD) can be used to maximize the variational lower bound and find the optimal variational parameters $\alpha_i$ and $\theta_i$. $\alpha_i$ may be usually called the dropout rate, and the above method of obtaining variational parameters $\alpha_i$ and $\theta_i$ by optimizing the variational lower bound may be usually called Variational Dropout.

After applying a perturbation over the weight coefficients W to generate a new weight coefficient W' the KL divergence $D_{KL}(p(y|x, W')\|p(y|x, W))$ between the output of the network layer $p(y|x, W')$ and the original output $p(y|x,W)$ may measure an importance of the contribution of the weight coefficients W in generating the output. In the context of network compression, value change over less important weight coefficients makes less impact on the network output. The second order approximation of $D_{KL}(p(y|x, W')\|p(y|x, W))$ may be:

$$D_{KL}(p(y|x, W')\|p(y|x, W)) \approx \delta W \cdot F \delta W + o(\delta W^2),$$

where F may be the Fisher Information Matrix (FIM), and for an empirical data distribution of x as Q(x), F may be given by:

$$F = E_{x \sim Q(x)} E_{y \sim p_W(y|x,W)}[\nabla_W \log p_W(y|x,W) \nabla_W \log p_W(y|x,W)^T].$$

To effectively compute F for independence of different weight coefficients, only the diagonal items in F may be needed. Each diagonal item $f_{ii}$ of the FIM can be considered as a local metric measuring the importance of the single weight $W_i$ over the network layer, and such an importance can be simply measured by the variance of the output change $\partial_{W_i} p_{W_i}(y|x, W)$ caused by the perturbation $\delta W_i$.

Therefore, to measure the importance of each single weight $W_i$, a multiplicative Gaussian random noise may be applied over the network input x and a gradient may be obtained over each weight coefficient $W_i$ through the Back Propagation (BP) computation of VD. The variance of such gradients of applying multiple multiplicative Gaussian random noises over a variety of different data inputs provides a reasonable estimation of the weight importance.

Figure 2A:
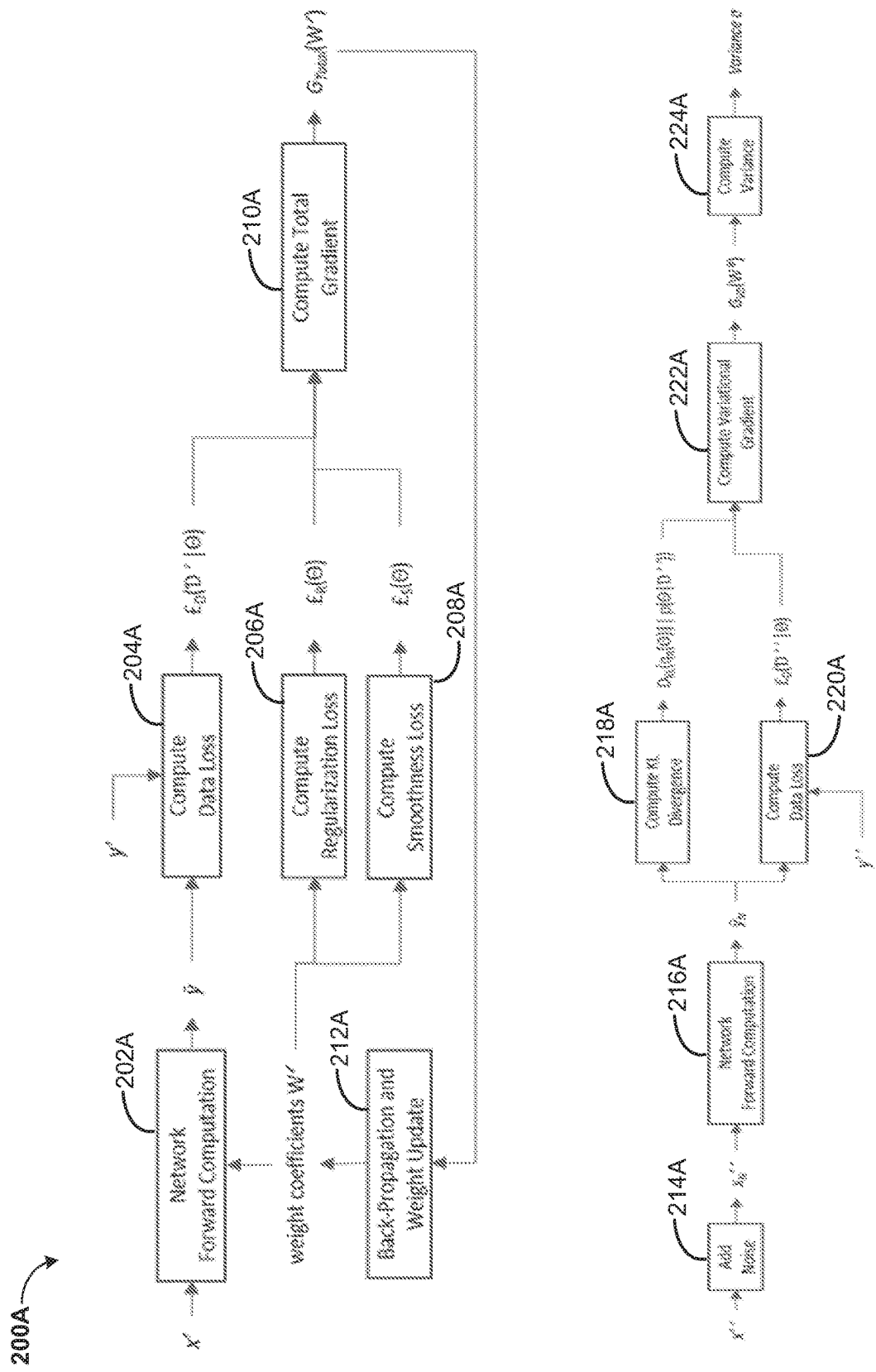
FIGS. 2A-2C are functional block diagrams of variance calculation systems, according to at least one embodiment.
Figure 2B:
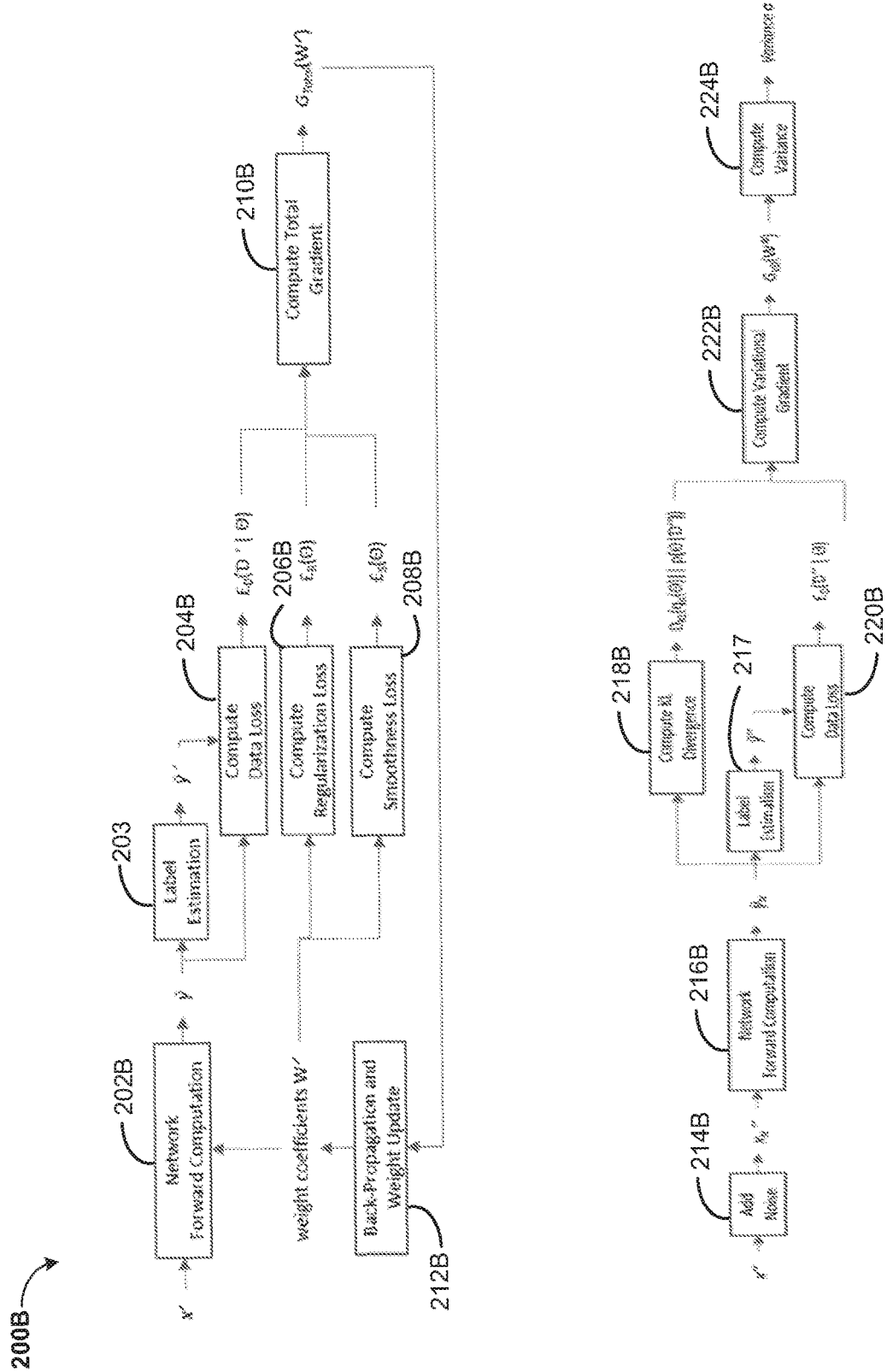
Figure 2C:
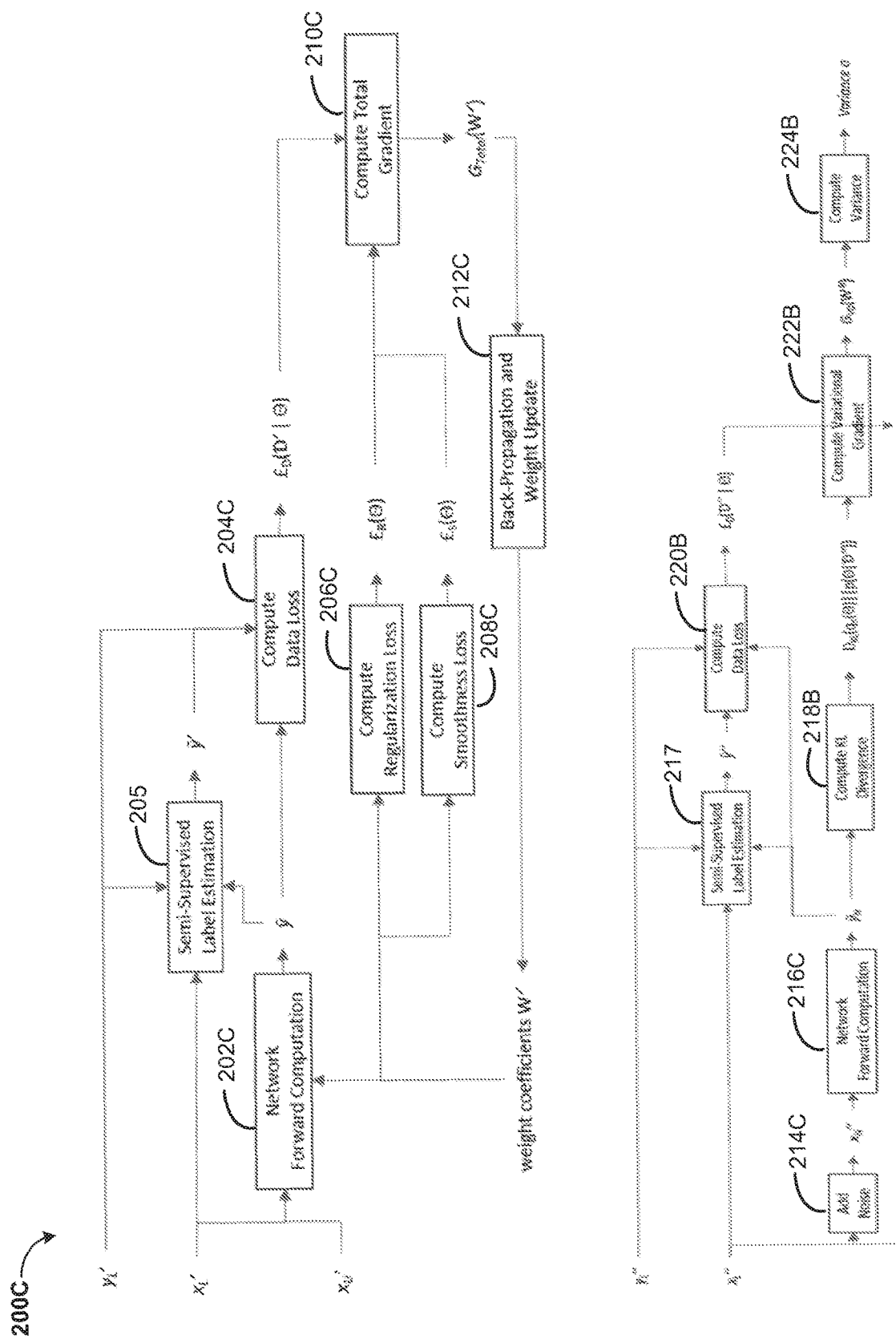

Referring now to FIG. 2A-2C, exemplary block diagrams of variance computation systems 200A-200C are depicted. The variance computation systems 200A-200C may use a pre-trained network with pre-trained weight coefficients W to find a set of updated optimal weight coefficients W* by minimizing a total loss value. The variance computation systems 200A-200C can process data in many forms. In general, an input x' may be a 4D tensor of data, such as video segments, images, or extracted feature maps. For example, x' can be a video segment of size (h, w, d, c), where h, w, and d may be the height, width and depth of the video segment. c may equal 3 if each video frame may be a color image, or c may equal 1 if each video frame may be a gray image. Input x' can also be an image of size (h, w, 1, c) as a reduced case of a video segment with length d=1. x' can also be an intermediate 4D feature map as an output of some feature extraction process. Similarly, the associated label y' may be a 4D tensor in general. For example, for classification tasks y' can be a binary vector of size (1,1,1,C) with each item in the vector denoting whether x' belongs to the corresponding class. For segmentation tasks, y' can be a video segment of size (h,w,d,c), where h, w, d, and c may be the height, width, length, and number of channels of the video segment, and each item in y' denotes the index of the segment the pixel of the corresponding channel at the corresponding spatial and temporal location belongs to. y' can reduce to an image when d may equal 1. y' can also be an intermediate 4D feature map similar to the case of x'.

Referring now to FIG. 2A, $\mathcal{D}' = \{(x',y')\}$ may denote a labeled dataset, where a label y' may be associated with each x'. $\mathcal{D}'$ can be the same as the original dataset $\mathcal{D} = \{(x,y)\}$ based on which the pre-trained weight coefficients W may be obtained. $\mathcal{D}'$ can also be a different dataset from $\mathcal{D}$, but with the same data distribution as the original dataset $\mathcal{D}$, i.e., x' and x has the same dimension, y' and y have the same dimension, and p(x',y')=p(x,y). A workflow may be used to obtain the optimal weight coefficients W* based on $\mathcal{D}'$.

The process may be separated into two stages. In the first stage, each input x' may be passed though the network via a Network Forward Computation module 202A using a current weight coefficients W', which may generates an estimated output $\bar{y}$. W' may be initialized as W'=W for the first iteration. Based on the ground-truth annotation y' and the estimated output $\bar{y}$, the data loss $\mathcal{L}_D(\mathcal{D}'|\Theta)$ can be computed through a Compute Data Loss module 204A. Through a Compute Regularization Loss module 206A, the regularization loss $\mathcal{L}_R(\Theta)$ can also be computed based on the current weight coefficients W'. Through a Compute Smoothness Loss module 208A, the smoothness loss $\mathcal{L}_S(\Theta)$ can be computed based on the current weight coefficients W'. Then the gradient of the total loss can be computed using a Compute Total Gradient module 210A to obtain a total gradient $G_{total}(W')$. The automatic gradient computing method used by deep learning frameworks such as tensorflow or pytorch can be used here to compute $G_{total}(W')$. Based on the total gradient $G_{total}(W')$, the weight coefficients can be updated through BP using a Back Propagation and Weight Update module 212A to obtain the updated W', and the system goes to the next iteration. The Back Propagation and Weight Update module 212A can choose to accumulate the total gradients $G_{total}(W')$ of a batch of inputs, and only updates the weight coefficients with the accumulated total gradients. The batch size may be usually a pre-defined hyperparameter, and the system iterates over all training data multiple times where each time may be called an epoch. The system usually run multiple epochs until the loss optimization converges.

After the above iterative process, a set of updated weight coefficients $W^*$ may be obtained. In the second stage, $D''=\{(x'',y'')\}$ denote a new labeled dataset, where a label $y''$ may be associated with each $x''$. $D''$ can be the same as the original dataset $D=\{(x,y)\}$ or the above $D'$. $D''$ can also be a different dataset from $D$ or $D'$, but with the same data distribution as the original dataset $D$ and $D'$, i.e., $x''$ and x (or $x'$) has the same dimension, $y''$ and y (or $y'$) have the same dimension, and $p(x'',y'')=p(x',y')=p(x,y)$. For each input $x''$, a multiplicative Gaussian noise may be added through an Add Noise module 214A to generate a noisy input $x_N''$, and the noisy input may be passed though the network via a Network Forward Computation module 216A using weight coefficients $W^*$, which generates an estimated output $\bar{y}_N$. Based on the ground-truth annotation $y''$ and the estimated output $\bar{y}_N$, the data loss $£_D(D''|\Theta)$ can be computed through a Compute Data Loss module 220A. The KL divergence $D_{KL}(q_\pi(\Theta)\|p(\Theta|D''))$ can be computed using a Compute KL Divergence module 218A. Then a gradient of the variational lower bound $G_{VD}(W^*)$ can be computed using a Compute Variational Gradient module 222A by using both the KL divergence $D_{KL}(q_\pi(\Theta)\|p(\Theta|D''))$ and the data loss $£_D(D''|\Theta)$. The automatic gradient computing method used by deep learning frameworks such as tensorflow or pytorch can be used here to compute $G_{VD}(W^*)$. The gradient may be accumulated by a Compute Variance module 224A for different data inputs $x''$, and a variance $\sigma$ can be computed. The variance can be used to measure the importance of the weight coefficients of the network.

Referring now to FIG. 2B, a non-labeled dataset $D'=\{x'\}$, where no label may be provided for each $x'$, may be used to obtain the optimal weight coefficients $W^*$. Comparing with the original dataset $D=\{(x,y)\}$ based on which the pre-trained weight coefficients $W$ may be obtained, $x'$ and x has the same dimension, and although no label may be provided, the target label to be estimated (denoted by $y'$) should have the same dimension with y, and $p(x',y')=_P(x,y)$.

Specifically, the process may be separated into two stages. In the first stage, each input $x'$ may be passed though the network via a Network Forward Computation module 202B using a current weight coefficients $W'$, which generates an estimated output $\bar{y}$. $W'$ may be initialized as $W'=W$ for the first iteration. Based on the estimated output y, a Label Estimation module 203 estimates a true label $\bar{y}'$ of $x'$, for example, by accumulating and averaging the probabilities $p(\bar{y}|x')$ during for T times ($T\geq 1$) with, either T different $x'$ as different noisy versions of applying Gaussian perturbations over $x'$, or T different sets of weight coefficients since the weight coefficients get updated during the training process. Using the estimated true label $\bar{y}'$ and the output $\bar{y}$, the data loss $£_D(D|\Theta)$ can be computed through a Compute Data Loss module 204B. Through a Compute Regularization Loss module 206B, the regularization loss $£_R(\Theta)$ can be computed based on a current weight coefficients $W'$. Through a Compute Smoothness Loss module 208B, the smoothness loss $£_S(\Theta)$ can be computed based on the current weight coefficients $W'$. Then the gradient of the total loss can be computed using a Compute Total Gradient module 210B to obtain the total gradient $G_{total}(W')$. The automatic gradient computing method used by deep learning frameworks such as tensorflow or pytorch can be used here to compute $G_{total}(W')$. Based on the total gradient $G_{total}(W')$, the weight coefficients can be updated through BP using a Back Propagation and Weight Update module 212B to obtain the updated $W'$, and the system goes to the next iteration. The Back Propagation and Weight Update module 212B can choose to accumulate the total gradients $G_{total}(W')$ of a batch of inputs, and only updates the weight coefficients with the accumulated total gradients. The batch size may be usually a pre-defined hyperparameter, and the system iterates over all training data multiple times where each time may be called an epoch. The system usually run multiple epochs until the loss optimization converges.

After the above process of the first stage, a set of updated weight coefficients $W^*$ may be obtained. In the second stage $D''=\{x''\}$ may denote a new unlabeled dataset. $D''$ can be the same as $D'$. $D''$ can also be a different dataset from $D'$, but with the same data distribution as $D'$, i.e., $x''$ and $x'$ has the same dimension, and although no label may be provided, the target label to be estimated (denoted by $y''$) should have the same dimension with the target label $y'$, and $p(x',y')=p(x'',y'')$.

For each input $x''$, a multiplicative Gaussian noise may be added through an Add Noise module 214B to generate a noisy input $x_N''$, and the noisy input may be passed though the network via a Network Forward Computation module 216B using weight coefficients $W^*$, which generates an estimated output $\bar{y}_N$. Based on the estimated output $\bar{y}_N$, a Label Estimation module 217 estimates a true label $\bar{y}''$ of $x''$, for example, by accumulating and averaging the probabilities $p(\bar{y}_N|x_N'')$ for T times ($T\geq 1$) with T different $x_N''$ as different noisy versions of applying Gaussian perturbations over $x''$. Based on the estimated output $\bar{y}''$ and the estimated output $\bar{y}_N$, the data loss $£_D(D''|\Theta)$ can be computed through a Compute Data Loss module 220B. The KL divergence $D_{KL}(q_\pi(\Theta)\|p(\Theta|D''))$ can be computed using a Compute KL Divergence module 218B. Then the gradient of the variational lower bound $G_{VD}(W^*)$ can be computed using a Compute Variational Gradient module 222B by using both the KL divergence $D_{KL}(q_\pi(\Theta)\|p(\Theta|D''))$ and the data loss $£_D(D''|\Theta)$. The automatic gradient computing method used by deep learning frameworks such as tensorflow or pytorch can be used here to compute $G_{VD}(W^*)$. The gradient may be accumulated by a Compute Variance module 224B for different data inputs $x''$, and a variance $\sigma$ can be computed. The variance can be used to measure the importance of the weight coefficients of the network.

Referring now to FIG. 2C, $D'=D_U'\cup D_L'$ may denote a partially labeled dataset, where $D_L'=\{(x_L', y_L')\}$ may be a labeled subset (which can be the same with or different from the original dataset where pre-trained weights may be trained) and $D_U'=\{x_U'\}$ may be an unlabeled subset. $x_L'$, $x_U'$ and x have the same dimension, and $y_L'$, y and the target label $y_U'$ to be estimated for $x_U'$ should have the same dimension, and $p(x_L',y_L')=p(x_U',y_U')=p(x,y)$. A workflow may be used to obtain the optimal weight coefficients $W^*$.

Specifically, the process may be separated into two stages. In the first stage, each input $x_L'$ or $x_U'$ may be passed though the network via a Network Forward Computation module 202C using a current weight coefficients $W'$, which generates an estimated output $\bar{y}$. $W'$ may be initialized as $W'=W$ for the first iteration.

When the input may be unlabeled $x_U'$, a Semi-Supervised Label Estimation module 205 estimates a true label $\bar{y}'$ of $x_U'$ by using the estimated output $\bar{y}$ and the labeled dataset $D_L'$. For example, the probabilities $p(\bar{y}|x')$ with, either different $x'$ as different noisy versions of applying Gaussian perturbations over $x_U'$, or different weight coefficients as the weight coefficients get updated during the iterative training process, can be accumulated, which may be a reasonable approximation of $p(\bar{y}|\mathcal{D}_U')$. Also, a probability estimation $p(\bar{y}|x_U', \mathcal{D}_L')$ can be computed using semi-supervised learning methods. Then $p(\bar{y}|x_U', \mathcal{D}_L')$ and $p(\bar{y}|\mathcal{D}_U')$ can be combined, e.g., weighted combined, to generate the estimation of the true label $\bar{y}'$. After that, using $\bar{y}'$ and $\bar{y}$, the data loss $\pounds_D(\mathcal{D}'|\Theta)$ can be computed through a Compute Data Loss module 204C. On the other hand, when the input may be labeled $x_L'$, the data loss $\pounds_D(\mathcal{D}'|\Theta)$ can be computed directly through the Compute Data Loss module 204C using $y_L'$ and $\bar{y}$.

Through a Compute Regularization Loss module 206C, the regularization loss $\pounds_X(\Theta)$ can be computed based on a current weight coefficients $W'$. Through a Compute Smoothness Loss module 208C, the smoothness loss $\pounds_S(\Theta)$ can be computed based on the current weight coefficients $W'$. Then the gradient of the total loss can be computed using a Compute Total Gradient module 210C to obtain the total gradient $G_{total}(W')$. The automatic gradient computing method used by deep learning frameworks such as tensorflow or pytorch can be used here to compute $G_{total}(W')$. Based on the total gradient $G_{total}(W')$, the weight coefficients can be updated through BP using a Back Propagation and Weight Update module 212C to obtain the updated $W'$, and the system goes to the next iteration. The Back Propagation and Weight Update module 212C can choose to accumulate the total gradients $G_{total}(W')$ of a batch of inputs, and only updates the weight coefficients with the accumulated total gradients. The batch size may be usually a pre-defined hyperparameter, and the system iterates over all training data multiple times where each time may be called an epoch. The system usually run multiple epochs until the loss optimization converges.

After the above process of the first stage, a set of updated weight coefficients $W^*$ may be obtained. In the second stage, $\mathcal{D}'' = \mathcal{D}_U'' \cup \mathcal{D}_L''$ may denote a partially labeled dataset, where $\mathcal{D}_L'' = \{(x_L'', y_L'')\}$ may be a labeled subset (which can be the same with or different from $\mathcal{D}_L''$ or $\mathcal{D}$, and $\mathcal{D}_U'' = \{x_U''\}$ may be an unlabeled subset. $x_L''$, $x_U''$, $x_L'$, $x_U'$ and x have the same dimension, and $y_L''$, $y_L'$, y and the target label $y_U''$ to be estimated for $x_U''$ should have the same dimension, and $p(x_L'', y_L'') = p(x_L', y_L') = p(x_U'', y_U'') = p(x_U', y_U') = p(x,y)$. For each input $x_L''$ or $x_U''$, a multiplicative Gaussian noise may be added through an Add Noise module 214C to generate a noisy input $x_N''$, and the noisy input may be passed though the network via a Network Forward Computation module 216C using weight coefficients $W^*$, which generates an estimated output $\bar{y}_N$.

When the input may be unlabeled $x_U''$, a Semi-Supervised Label Estimation module 219 estimates a true label $\bar{y}''$ of $x_U''$ by using the estimated output $\bar{y}_N$ and the labeled dataset $\mathcal{D}_L''$. For example, the probabilities $p(\bar{y}_N|x_N'')$ with different $x_N''$ as different noisy versions of applying Gaussian perturbations over $x_U''$ can be accumulated, which may be a reasonable approximation of $p(\bar{y}''|\mathcal{D}_U'')$. Also, a probability estimation $p(\bar{y}''|x_U'', \mathcal{D}_L'')$ can be computed using semi-supervised learning methods. Then $p(\bar{y}''|x_U'', \mathcal{D}_L'')$ and $p(\bar{y}''|\mathcal{D}_U'')$ can be combined, e.g., weighted combined, to generate the estimation of the true label $\bar{y}''$. After that, using $\bar{y}''$ and $\bar{y}_N$, the data loss $\pounds_D(\mathcal{D}''|\Theta)$ can be computed through a Compute Data Loss module 220C. On the other hand, when the input may be labeled $x_L''$, the data loss $\pounds_D(\mathcal{D}''|\Theta)$ can be computed directly through the Compute Data Loss module 220C using $y_L''$ and $\bar{y}$. The KL divergence $D_{KL}(q_\pi(\Theta)\|p(\Theta|\mathcal{D}''))$ can be computed using a Compute KL Divergence module 218C. Then the gradient of the variational lower bound $G_{VD}(W^*)$ can be computed using a Compute Variational Gradient module 222C by using both the KL divergence $D_{KL}(q_\pi(\Theta)\|p(\Theta|\mathcal{D}''))$ and the data loss $\pounds_D(\mathcal{D}''|\Theta)$. The automatic gradient computing method used by deep learning frameworks such as tensorflow or pytorch can be used here to compute $G_{VD}(W^*)$. The gradient may be accumulated by a Compute Variance module 224C for different data inputs $x''$, and a variance $\sigma$ can be computed. The variance can be used to measure the importance of the weight coefficients of the network.

Figure 3:
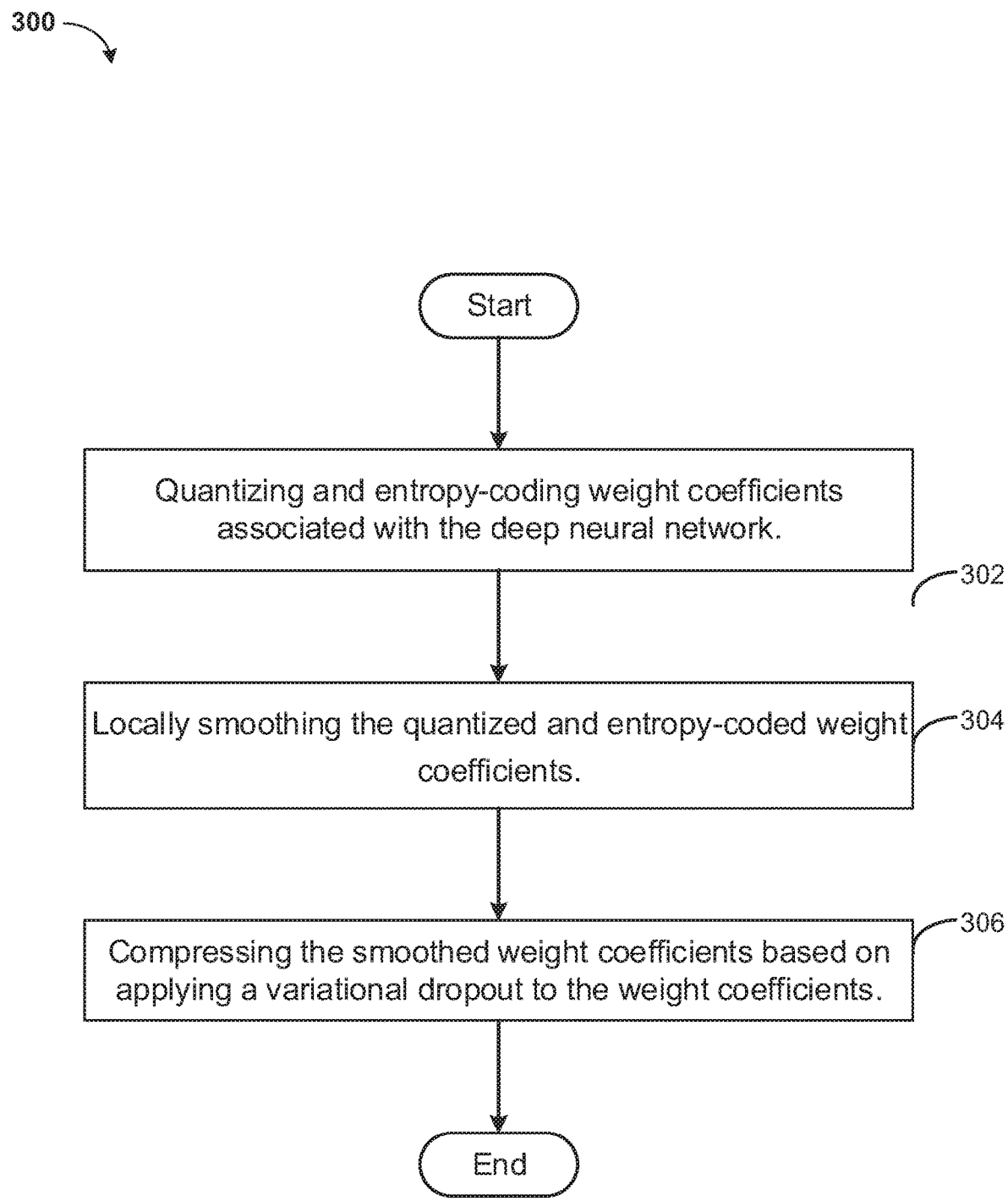
FIG. 3 is an operational flowchart illustrating the steps carried out by a program that compresses a deep neural network model, according to at least one embodiment.

Referring now to FIG. 3, an operational flowchart illustrating the steps of a method 300 for compressing a deep neural network model is depicted. In some implementations, one or more process blocks of FIG. 3 may be performed by the computer 102 (FIG. 1) and the server computer 114 (FIG. 1). In some implementations, one or more process blocks of FIG. 3 may be performed by another device or a group of devices separate from or including the computer 102 and the server computer 114.

At 302, the method 300 includes quantizing and entropy-coding weight coefficients associated with the deep neural network.

At 304, the method 300 includes locally smoothing the quantized and entropy-coded weight coefficients.

At 306, the method 300 includes compressing the smoothed weight coefficients based on applying a variational dropout to the weight coefficients.

It may be appreciated that FIG. 3 provides only an illustration of one implementation and does not imply any limitations with regard to how different embodiments may be implemented. Many modifications to the depicted environments may be made based on design and implementation requirements.

Figure 4:
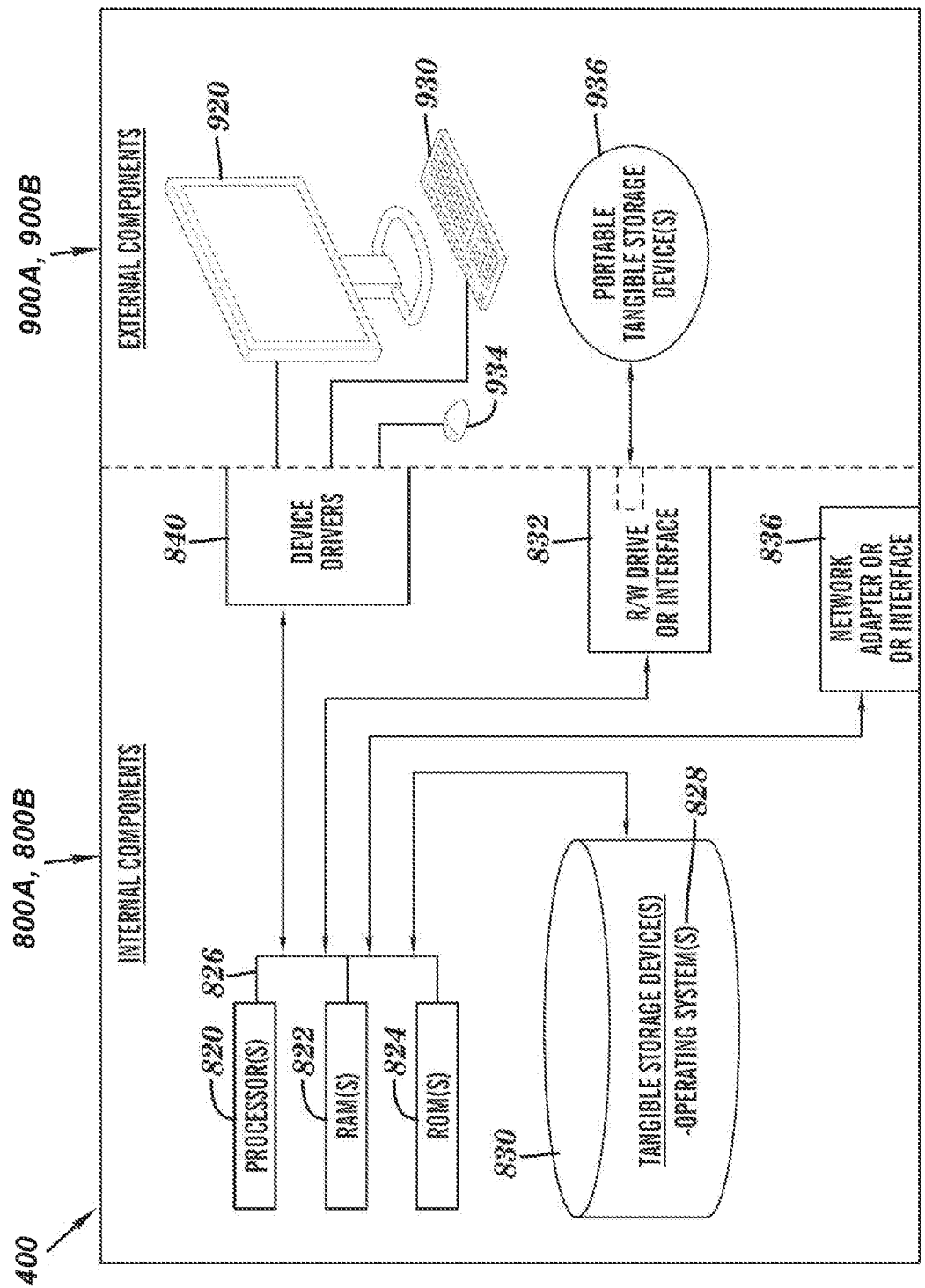
FIG. 4 is a block diagram of internal and external components of computers and servers depicted in FIG. 1 according to at least one embodiment.

FIG. 4 is a block diagram 400 of internal and external components of computers depicted in FIG. 1 in accordance with an illustrative embodiment. It should be appreciated that FIG. 4 provides only an illustration of one implementation and does not imply any limitations with regard to the environments in which different embodiments may be implemented. Many modifications to the depicted environments may be made based on design and implementation requirements.

Computer 102 (FIG. 1) and server computer 114 (FIG. 1) may include respective sets of internal components 800A,B and external components 900A,B illustrated in FIG. 4. Each of the sets of internal components 800 include one or more processors 820, one or more computer-readable RAMs 822 and one or more computer-readable ROMs 824 on one or more buses 826, one or more operating systems 828, and one or more computer-readable tangible storage devices 830.

Processor 820 is implemented in hardware, firmware, or a combination of hardware and software. Processor 820 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 820 includes one or more processors capable of being programmed to perform a function. Bus 826 includes a component that permits communication among the internal components 800A,B.

The one or more operating systems 828, the software program 108 (FIG. 1) and the DNN Model Compression Program 116 (FIG. 1) on server computer 114 (FIG. 1) are stored on one or more of the respective computer-readable tangible storage devices 830 for execution by one or more of the respective processors 820 via one or more of the respective RAMs 822 (which typically include cache memory). In the embodiment illustrated in FIG. 4, each of the computer-readable tangible storage devices 830 is a magnetic disk storage device of an internal hard drive. Alternatively, each of the computer-readable tangible storage devices 830 is a semiconductor storage device such as ROM 824, EPROM, flash memory, an optical disk, a magneto-optic disk, a solid state disk, a compact disc (CD), a digital versatile disc (DVD), a floppy disk, a cartridge, a magnetic tape, and/or another type of non-transitory computer-readable tangible storage device that can store a computer program and digital information.

Each set of internal components 800A,B also includes a R/W drive or interface 832 to read from and write to one or more portable computer-readable tangible storage devices 936 such as a CD-ROM, DVD, memory stick, magnetic tape, magnetic disk, optical disk or semiconductor storage device. A software program, such as the software program 108 (FIG. 1) and the DNN Model Compression Program 116 (FIG. 1) can be stored on one or more of the respective portable computer-readable tangible storage devices 936, read via the respective R/W drive or interface 832 and loaded into the respective hard drive 830.

Each set of internal components 800A,B also includes network adapters or interfaces 836 such as a TCP/IP adapter cards; wireless Wi-Fi interface cards; or 3G, 4G, or 5G wireless interface cards or other wired or wireless communication links. The software program 108 (FIG. 1) and the DNN Model Compression Program 116 (FIG. 1) on the server computer 114 (FIG. 1) can be downloaded to the computer 102 (FIG. 1) and server computer 114 from an external computer via a network (for example, the Internet, a local area network or other, wide area network) and respective network adapters or interfaces 836. From the network adapters or interfaces 836, the software program 108 and the DNN Model Compression Program 116 on the server computer 114 are loaded into the respective hard drive 830. The network may comprise copper wires, optical fibers, wireless transmission, routers, firewalls, switches, gateway computers and/or edge servers.

Each of the sets of external components 900A,B can include a computer display monitor 920, a keyboard 930, and a computer mouse 934. External components 900A,B can also include touch screens, virtual keyboards, touch pads, pointing devices, and other human interface devices. Each of the sets of internal components 800A,B also includes device drivers 840 to interface to computer display monitor 920, keyboard 930 and computer mouse 934. The device drivers 840, R/W drive or interface 832 and network adapter or interface 836 comprise hardware and software (stored in storage device 830 and/or ROM 824).

It is understood in advance that although this disclosure includes a detailed description on cloud computing, implementation of the teachings recited herein are not limited to a cloud computing environment. Rather, some embodiments are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 5:
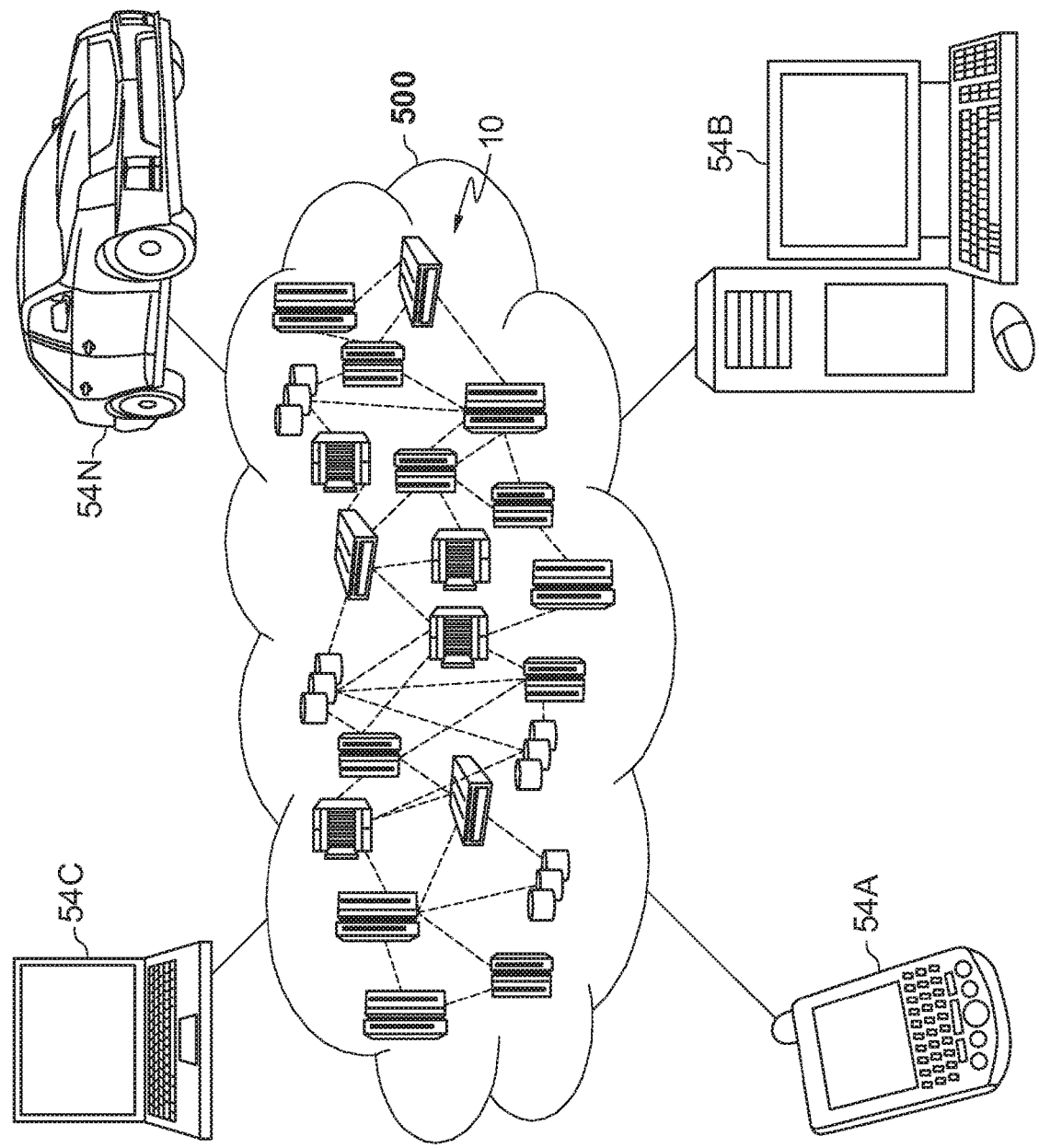
FIG. 5 is a block diagram of an illustrative cloud computing environment including the computer system depicted in FIG. 1, according to at least one embodiment.

Referring to FIG. 5, illustrative cloud computing environment 500 is depicted. As shown, cloud computing environment 500 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Cloud computing nodes 10 may communicate with one another. They may be grouped (not shown) physically or virtually, in one or more networks, such as Private, Community, Public, or Hybrid clouds as described hereinabove, or a combination thereof. This allows cloud computing environment 500 to offer infrastructure, platforms and/or software as services for which a cloud consumer does not need to maintain resources on a local computing device. It is understood that the types of computing devices 54A-N shown in FIG. 5 are intended to be illustrative only and that cloud computing nodes 10 and cloud computing environment 500 can communicate with any type of computerized device over any type of network and/or network addressable connection (e.g., using a web browser).

Figure 6:
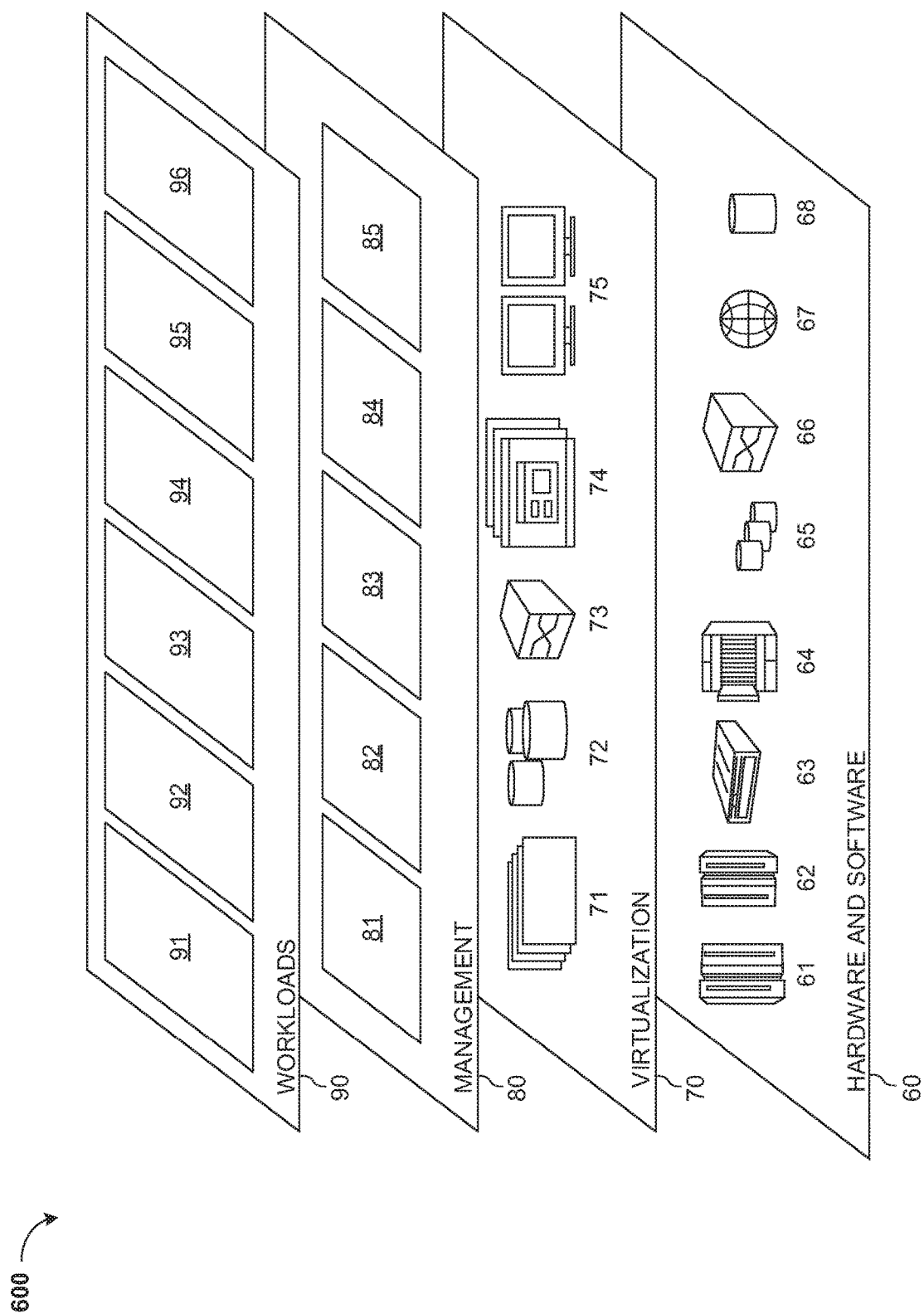
FIG. 6 is a block diagram of functional layers of the illustrative cloud computing environment of FIG. 5, according to at least one embodiment.

Referring to FIG. 6, a set of functional abstraction layers 600 provided by cloud computing environment 500 (FIG. 5) is shown. It should be understood in advance that the components, layers, and functions shown in FIG. 6 are intended to be illustrative only and embodiments are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and DNN Model Compression 96. DNN Model Compression 96 may compress a deep neural network model based on using a smoothness regularization in a variational dropout framework.

Some embodiments may relate to a system, a method, and/or a computer readable medium at any possible technical detail level of integration. The computer readable medium may include a computer-readable non-transitory storage medium (or media) having computer readable program instructions thereon for causing a processor to carry out operations.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program code/instructions for carrying out operations may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects or operations.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer readable media according to various embodiments. In this regard, each block in the flowchart or block diagrams may represent a module, segment, or portion of instructions, which comprises one or more executable instructions for implementing the specified logical function(s). The method, computer system, and computer readable medium may include additional blocks, fewer blocks, different blocks, or differently arranged blocks than those depicted in the Figures. In some alternative implementations, the functions noted in the blocks may occur out of the order noted in the Figures. For example, two blocks shown in succession may, in fact, be executed concurrently or substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware may be designed to implement the systems and/or methods based on the description herein.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

The descriptions of the various aspects and embodiments have been presented for purposes of illustration, but are not intended to be exhaustive or limited to the embodiments disclosed. Even though combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of compressing a deep neural network model, executable by a processor, the method comprising:
    quantizing and entropy-coding weight coefficients associated with the deep neural network;
    locally smoothing the quantized and entropy-coded weight coefficients; and compressing the smoothed weight coefficients based on applying a variational dropout to the weight coefficients.

2. The method of claim 1, wherein the weight coefficients correspond to dimensions associated with a multi-dimensional tensor.

3. The method of claim 1, wherein the weight coefficients are locally smoothed based on determining a gradient associated with the weight coefficients.

4. The method of claim 1, wherein the weight coefficients are locally smoothed based on minimizing a loss value associated with a smoothness metric of the weight coefficients.

5. The method of claim 4, wherein the loss value is minimized based on selecting a subset of weight coefficients from among the weight coefficients.

6. The method of claim 4, wherein the smoothness metric corresponds to an absolute value of gradients of the weight coefficients at one or more axes measured at a point based on balancing contributions of the gradients at the one or more axes.

7. The method of claim 4, further comprising training the deep neural network based on the minimized loss value.

8. A computer system for compressing a deep neural network model, the computer system comprising:
one or more computer-readable non-transitory storage media configured to store computer program code; and
one or more computer processors configured to access said computer program code and operate as instructed by said computer program code, said computer program code including:
quantizing and entropy-coding code configured to cause the one or more computer processors to quantize and entropy-code weight coefficients associated with the deep neural network;
smoothing code configured to cause the one or more computer processors to locally smooth the quantized and entropy-coded weight coefficients; and
compressing code configured to cause the one or more computer processors to compress the smoothed weight coefficients based on applying a variational dropout to the weight coefficients.

9. The computer system of claim 8, wherein the weight coefficients correspond to dimensions associated with a multi-dimensional tensor.

10. The computer system of claim 8, wherein the weight coefficients are locally smoothed based on determining a gradient associated with the weight coefficients.

11. The computer system of claim 8, wherein the weight coefficients are locally smoothed based on minimizing a loss value associated with a smoothness metric of the weight coefficients.

12. The computer system of claim 11, wherein the loss value is minimized based on selecting a subset of weight coefficients from among the weight coefficients.

13. The computer system of claim 11, wherein the smoothness metric corresponds to an absolute value of gradients of the weight coefficients at one or more axes measured at a point based on balancing contributions of the gradients at the one or more axes.

14. The computer system of claim 11, further comprising training code configured to cause the one or more computer processors to train the deep neural network based on the minimized loss value.

15. A non-transitory computer readable medium having stored thereon a computer program for compressing a deep neural network model, the computer program configured to cause one or more computer processors to:
quantize and entropy-code weight coefficients associated with the deep neural network;
locally smooth the quantized and entropy-coded weight coefficients; and
compress the smoothed weight coefficients based on applying a variational dropout to the weight coefficients.

16. The computer readable medium of claim 15, wherein the weight coefficients correspond to dimensions associated with a multi-dimensional tensor.

17. The computer readable medium of claim 15, wherein the weight coefficients are locally smoothed based on determining a gradient associated with the weight coefficients.

18. The computer readable medium of claim 15, wherein the weight coefficients are locally smoothed based on minimizing a loss value associated with a smoothness metric of the weight coefficients.

19. The computer readable medium of claim 18, wherein the loss value is minimized based on selecting a subset of weight coefficients from among the weight coefficients.

20. The computer readable medium of claim 18, wherein the smoothness metric corresponds to an absolute value of gradients of the weight coefficients at one or more axes measured at a point based on balancing contributions of the gradients at the one or more axes.

* * * * *